(12) United States Patent
La Rosa et al.

(10) Patent No.: US 6,958,621 B2
(45) Date of Patent: Oct. 25, 2005

(54) METHOD AND CIRCUIT FOR ELEMENT WEAROUT RECOVERY

(75) Inventors: Giuseppe La Rosa, Fishkill, NY (US); Joseph M. Lukaitis, Pleasant Valley, NY (US); Anastasios A. Katsetos, Poughkeepsie, NY (US); Stewart E. Rauch, III, Poughkeepsie, NY (US); Ping-Chuan Wang, Hopewell Jct, NY (US); Stephen P. Boffoli, Wappingers Falls, NY (US); Fernando J. Guarin, Millbrook, NY (US); B. B. (Bob) Lawhorn, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 10/725,984

(22) Filed: Dec. 2, 2003

(65) Prior Publication Data

US 2005/0116739 A1 Jun. 2, 2005

(51) Int. Cl.[7] .......................................... H03K 19/003
(52) U.S. Cl. .......................................... 326/9; 326/82
(58) Field of Search ................................ 326/9, 10, 16, 326/82–86

(56) References Cited

U.S. PATENT DOCUMENTS

| | | | | |
|---|---|---|---|---|
| 3,691,376 A | * | 9/1972 | Bauerlein et al. | 438/351 |
| 4,238,694 A | | 12/1980 | Kimerling et al. | 307/238 |
| 4,370,175 A | * | 1/1983 | Levatter | 438/57 |
| 5,070,383 A | * | 12/1991 | Sinar et al. | 257/537 |
| 5,956,350 A | | 9/1999 | Irrinki et al. | 371/21.1 |
| 6,355,493 B1 | * | 3/2002 | Usenko | 438/4 |

\* cited by examiner

*Primary Examiner*—Don Le
(74) *Attorney, Agent, or Firm*—Daryl Neff

(57) ABSTRACT

A recovery circuit and a method for employing the same are provided. The recovery circuit has a current driver and, preferably two pass-gates, a first pass-gate connected in series to the current driver and a second pass-gate connected to a ground. The recovery circuit also has a recovery assembly or element and one or more contacts operatively connecting the recovery circuit to a wearout sensitive circuit or circuit element.

20 Claims, 8 Drawing Sheets

METHOD AND CIRCUIT FOR ELEMENT WEAROUT RECOVERY

BACKGROUND OF THE INVENTION

1. Field of the Invention

The present invention relates to semiconductor technology. More particularly, the present invention relates to a method and circuit for element wearout recovery.

2. Description of the Prior Art

It is well known in the semiconductor industry that certain physical properties associated with solid-state devices are subject to a variety of mechanical, electrical and/or chemical failure mechanisms. It is known that elements, such as, for example, transistors from both CMOS and Bipolar technologies, are susceptible during product use to certain reliability wearout mechanisms that can severely impact the efficient operation of a circuit design.

Hot-carrier degradation in NMOS and PMOS elements is, for example, a MOSFET wearout mechanism that can, over time, impact circuit performance in both CMOS and Bipolar or BICMOS operations (e.g., reduce the on-state current in an NMOS element and/or increase the off-state current in a PMOS element). Another example is NBTI. NBTI competes with bias-temperature degradation in PMOS elements during circuit operations and is a key process and design limiter in advanced CMOS technologies. NBTI is very dependent on temperature and gate bias. Hot-carrier and NBTI degradation contributions can be distinguished by stressing at different temperatures. In addition, in Bipolar transistors, beta degradation and electromigration induced stress build-up on the poly emitter may also affect overall circuit performance.

It is also well known that most of the degradation resulting from the various wearout mechanisms, and impacting circuit element operation, can be recovered or repaired via an appropriate high temperature bake. For example, U.S. Pat. No. 4,238,694 discloses a method for recovering selected areas of a radiation damaged semiconductor.

Drawbacks associated with the foregoing and other known healing or recovery techniques, include the need to electrically adjust the selected semiconductor device to be sensitive to a specific electronic healing mechanism, the limited application of healing only damage resulting from radiation, the lack of healing specificity in using thermal energy, and/or the inability to use repeatedly the particular recovery technique.

Thus, notwithstanding what is known, there remains a need for an efficient method and circuit that can provide localized thermal healing to recover specific elements in specific circuits damaged and/or aged by specific wearout mechanisms (e.g., hot-carrier, NBTI, etc.).

SUMMARY OF THE INVENTION

It is an object of the present invention to provide a recovery circuit that may be operatively connected to a circuit and/or a circuit element sensitive to a peculiar device wearout mechanism to allow at least a partial recovery thereof.

It is another object of the present invention to provide a recovery circuit that may be implemented as often as needed and at any time during the operative life of a circuit and/or circuit element.

It is still another object of the present invention to provide a recovery circuit that may be easily implemented to any circuit (analog, digital, etc.) application.

It is yet another object of the present invention to provide a recovery circuit that has a recovery element that may be integral or external to a wearout sensitive circuit element.

It is yet still another object of the present invention to provide a recovery circuit that uses localized heating to heal or recover a specific locally selected circuit and/or circuit element.

It is a further object of the present invention to provide a method for recovering a wearout sensitive circuit and/or a wearout sensitive circuit element.

It is still a further object of the present invention to provide a method for locally heating and/or healing specific wearout sensitive devices.

These and other objects and advantages of the present invention are achieved by a method and circuit for circuit element wearout recovery that can be easily implemented to any circuit (e.g., analog, digital, etc.) application, that can be used at any time, and/or as often as needed, during the operative life of a circuit, and that satisfies the need for an efficient method and circuit for providing localized thermal healing to recover specific circuit elements in specific circuits damaged and/or aged by specific wearout mechanisms.

The recovery circuit of the present invention preferably has a current driver, at least two pass-gates, a first pass-gate connected in series to the current driver and a second pass-gate connected to a ground. The recovery circuit also has a recovery assembly or element and one or more contacts operatively connecting the recovery circuit to a wearout sensitive circuit or circuit element.

DETAILED DESCRIPTION OF THE INVENTION

Figure 1:
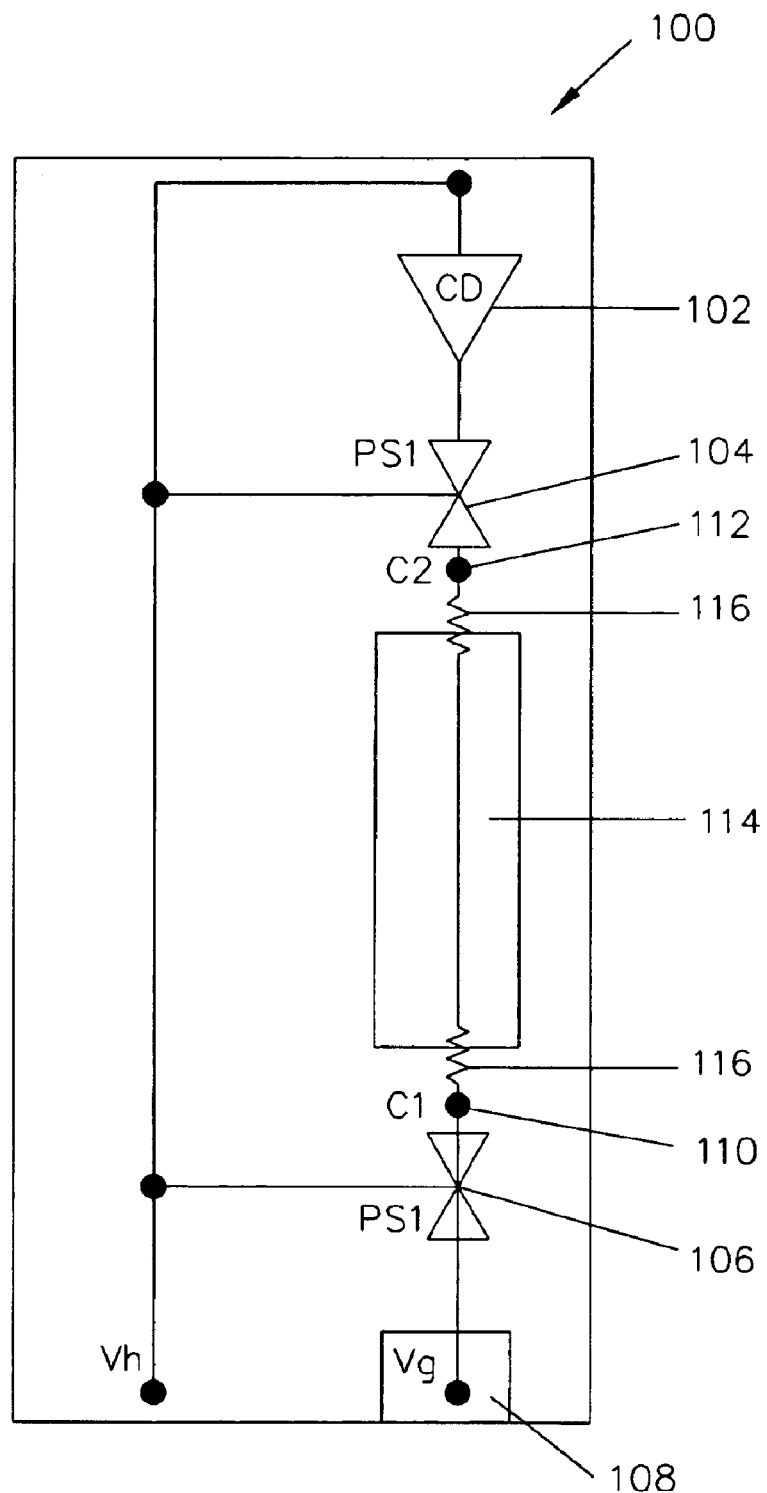
FIG. 1 is a schematic diagram of a recovery circuit in accordance with an illustrative embodiment of the present invention.

Referring to the drawings and, in particular, FIG. 1, a recovery circuit in accordance with an illustrative embodiment of the present invention is shown and generally represented by reference numeral 100. Recovery circuit 100 preferably has at least one current driver 102, at least one first pass-gate 104 and at least one second pass-gate 106.

First pass-gate 104 is preferably connected in series to current driver 102 and second pass-gate 106 is preferably connected to a ground 108.

Recovery circuit 100 preferably also has at least one first contact 110 and at least one second contact 112 that preferably connect the recovery circuit 100 to at least one specific circuit device or element 114. This connection between recovery circuit 100 and circuit element 114, which can be sensitive to a peculiar wearout mechanism, allows for at least a partial, or preferably, a full recovery of circuit element 114 at any time, as necessary, during production operation.

In a preferred aspect of the present invention, circuit element 114 has one or more resistors 116. Resistor 116 can be connected to recovery circuit 100 via first contact 110 and/or second contact 112. Resister 116 preferably facilitates in the selective local healing or recovery of circuit element 114 at any time during the operative life thereof. That is, when a voltage signal (Vh) activates current driver 102 and closes first pass-gate 104 and second pass-gate 106, current, provided by current driver 102, can pass through resistors 116 to increase the temperature of circuit element 114 to initiate a recovery mechanism via recovery circuit 100.

Figure 2A:
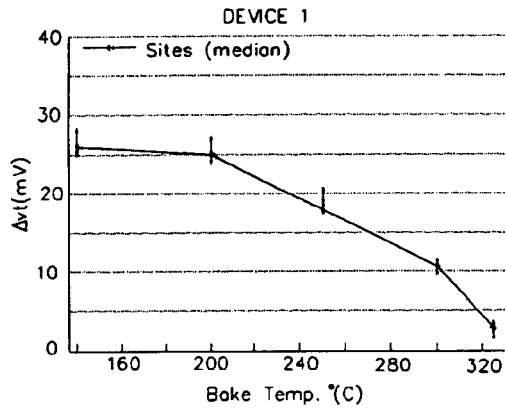
FIGS. 2A through 2D are chart representations illustratively showing the recovery of a number of degraded circuit elements (e.g., MOSFETS)
Figure 2B:
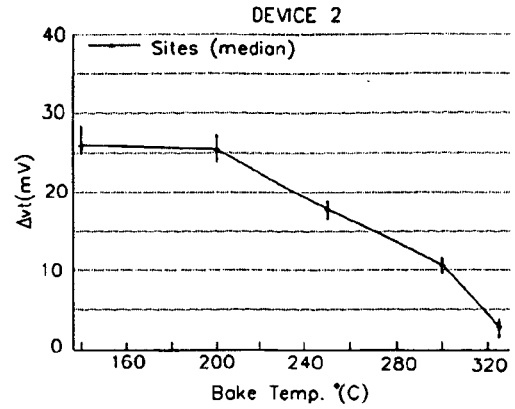
Figure 2C:
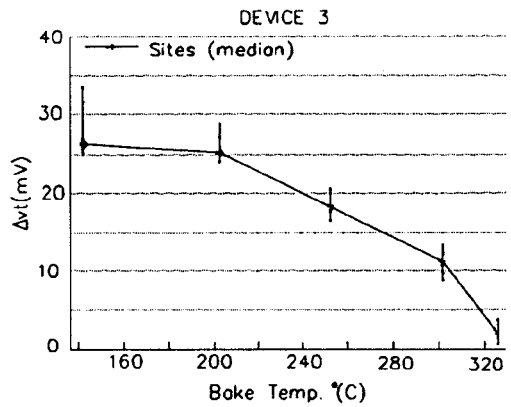
Figure 2D:
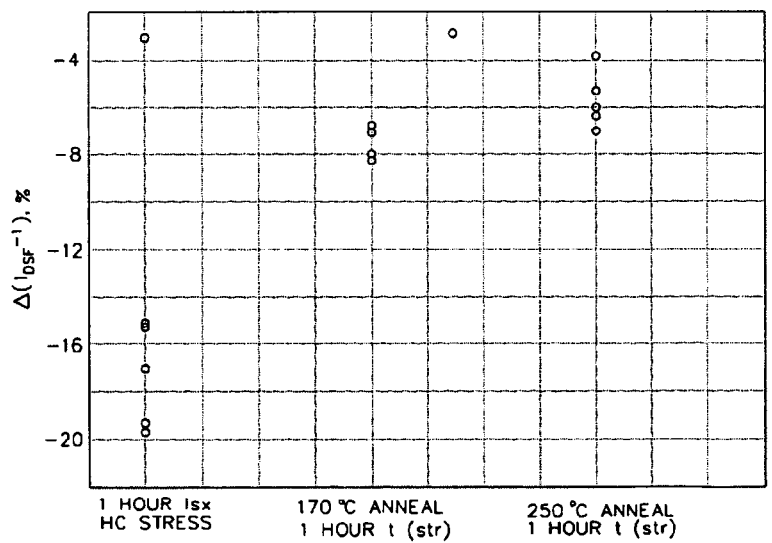

Referring to FIGS. 2A through 2D, the thermal recovery of several degraded circuit elements (e.g., MOSFETs) is graphically depicted. FIGS. 2A to 2C illustrate the recovery of certain circuit elements that have been damaged or degraded by a NBTI symmetric stress for 20 hours at a temperature of about 140° C. As shown, a sequential exposure of the degraded circuit element to several approximately one hour bakes at temperatures ranging from about 140° C. to about 325° C. results in at least a partial recovery. In particular, it is evidenced that the degree or extent of recovery is, at least in part, if not entirely, dependent on the bake temperature. For example, it appears that within a period of about an hour a full recovery is experienced at a bake temperature of about 325° C. This correlation is also reflected in FIG. 2D, which shows a circuit element (e.g., NFETs) that has been damaged or degraded during about an hour of exposure to a hot-carrier stress. As shown, after a bake of about one hour at a temperature of about 170° C., the circuit element recovers by about 12%. While, after a bake of about one hour at a temperature of about 250° C., the circuit element recovers by about 16%.

Thus, the observations reflected in FIGS. 2A to 2D suggest that it is possible to recover a circuit sensitive element parameter of a degraded circuit element (e.g., transistor) to a level that is adequate to recover circuit functionality via an appropriate bake temperature for given amount of time.

Figure 3:
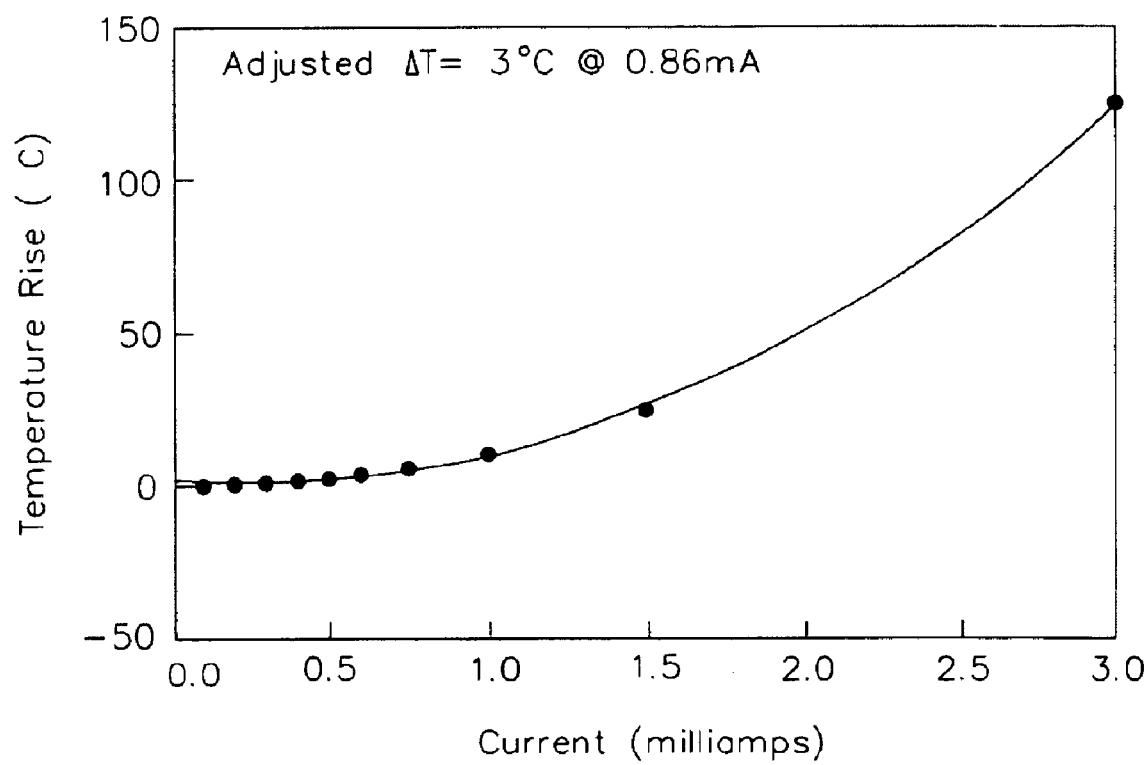
FIG. 3 is a plot illustrating a temperature increase resulting from a current being driven through a polygate of a circuit element in accordance with an illustrative embodiment of the present invention.

Referring to FIG. 3, in another embodiment or aspect of the present invention, a process for reaching an appropriate bake temperature may be accomplished and/or controlled by both the thermal conductivity and the power of current. The relationship can be described by:

$$T = T(Amb) + (K^* P^2)$$

where T is the bake temperature, T(Amb) is the ambient temperature, K is the conductivity, and P is the power. The power dissipated is expressed by:

$$P = R^* I^2 \approx \rho^* L/W^* I^2$$

where R is the resistance, I is the current, L represents length and W represents width. Thus, for a given configuration (W,L) the following expression can give an expected increase in temperature relative to the T(Amb) for a given current (I) passing through resistors 116:

$$T \approx T(Amb) + (K^*(\rho^* L/W^* I^2)^2)$$

Accordingly, as reflected in FIG. 3, a temperature increase of about 125° C. above T(Amb) is possible if about 3 mA of current (I) is driven through a polygate of a MOSFET element, for example.

Figure 4:
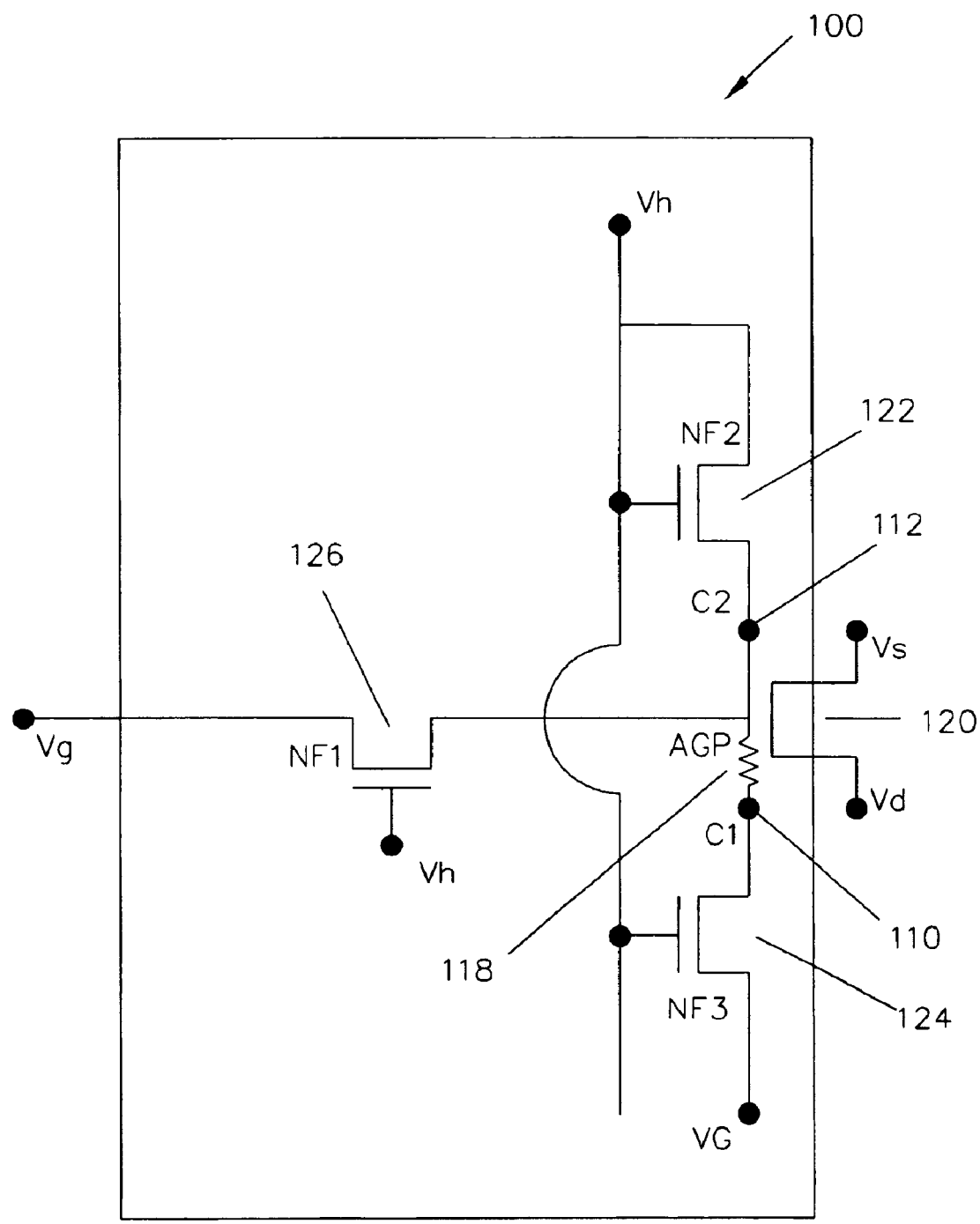
FIG. 4 is a schematic diagram of a circuit element for DC operation in accordance with another illustrative embodiment of the present invention.

Referring to FIG. 4, in still another aspect or embodiment of the present invention, recovery circuit 100 can be implemented as part of a DC operating circuit. As shown, an active gate polyresistor (AGP) 118 can be operatively connected to a gate structure 120, preferably part of a MOSFET transistor, or the like, for localized self-heating and wearout recovery thereof. It is noted that this configuration may be implemented in both digital (e.g., input/output drivers) and analog circuit design schemes.

In this particular aspect of the present invention, a first component 122, a negative channel field effect transistor (NFET) current driver, for example, preferably operates to deliver a current (I) to AGP 118, a second component 124 (e.g., a second NFET), preferably operates to connect AGP 118 to a ground (VG), and a third component 126 (e.g., a third NFET), preferably operates to assure that elements (e.g., first and second contacts 110, 112) of AGP 118 are floating when recovery circuit 100 is not activated. Activation of AGP 118 is preferably driven by a voltage signal (Vh1), which activates first component 122 and second component 124 so that current may be delivered to AGP 118 while at the same time, a complementary voltage signal (Vh2), preferably relatively high (Vhigh), may be used to deactivate third component 126. Thus, in this aspect of the present invention, during operation of gate structure 120 first and second contacts 110, 112 are preferably floating, while the third component 126 remains activated (Vh2) to apply (VG) to gate structure 120.

Figure 5:
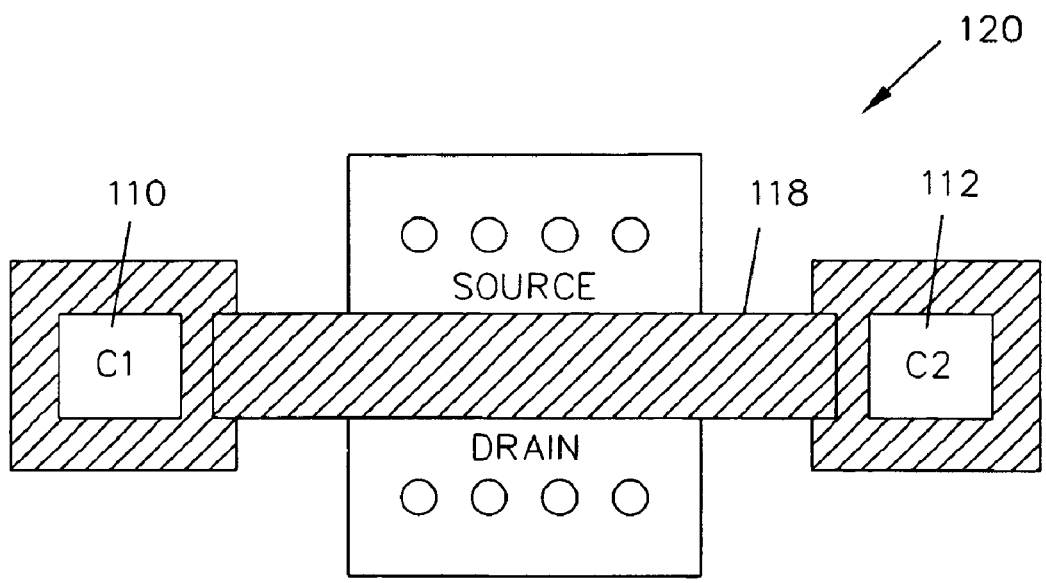
FIG. 5 is a schematic diagram of a self aligned polyresistor that is part of a gate structure of the circuit of FIG. 4.
Figure 6:
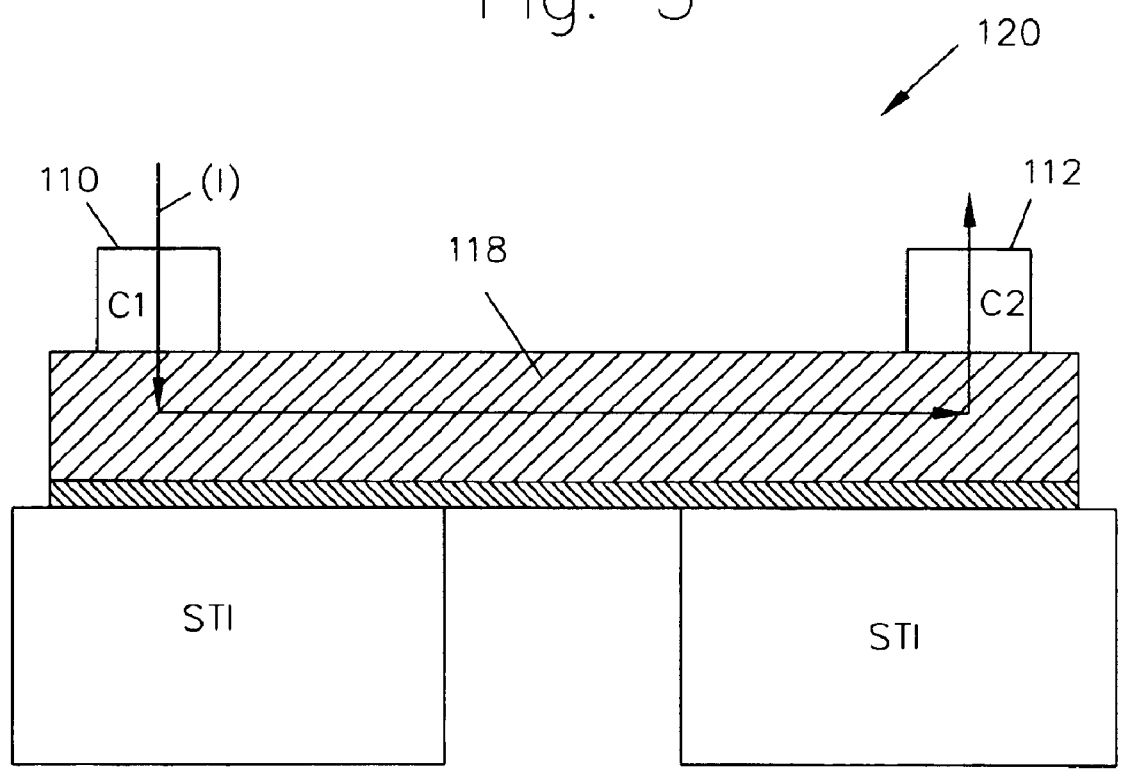
FIG. 6 is a cross-section view of the polyresistor of FIG. 5 showing the current flow.

FIGS. 5 and 6, illustrate that in yet another embodiment or aspect of the present invention, AGP 118 may be an integral part (self-aligned) of gate structure 120 and the DC operation circuit. As shown, preferably an appropriate amount of current, preferably determined using the formulas previously discussed, passes from first contact 110 through AGP 118 to second contact 112. As previously stated, this allows for localized heating and/or recovery of specific wearout sensitive circuit elements in DC operations.

Figure 7:
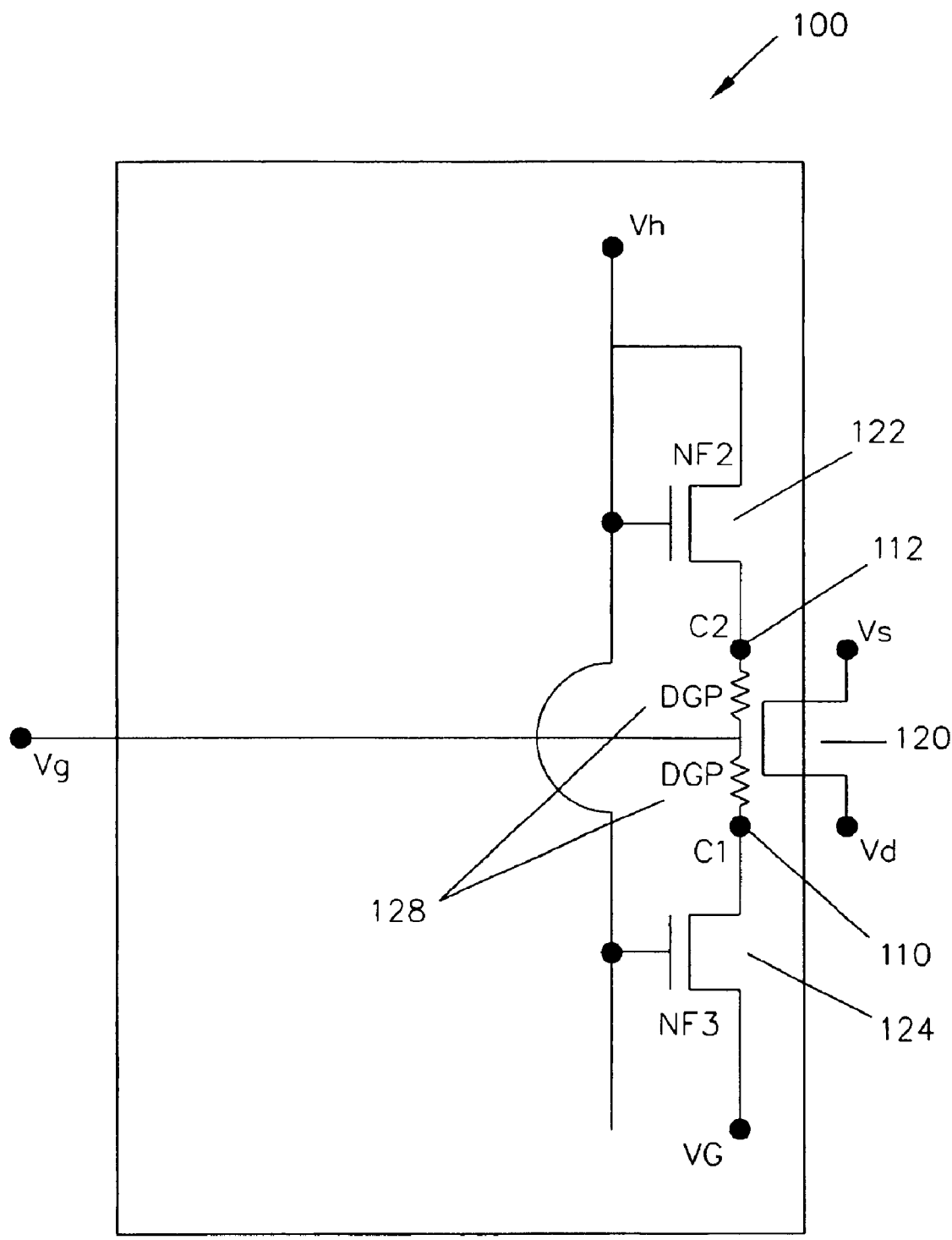
FIG. 7 is a schematic diagram of a circuit element for AC operation in accordance with still another illustrative embodiment of the present invention.
Figure 8:
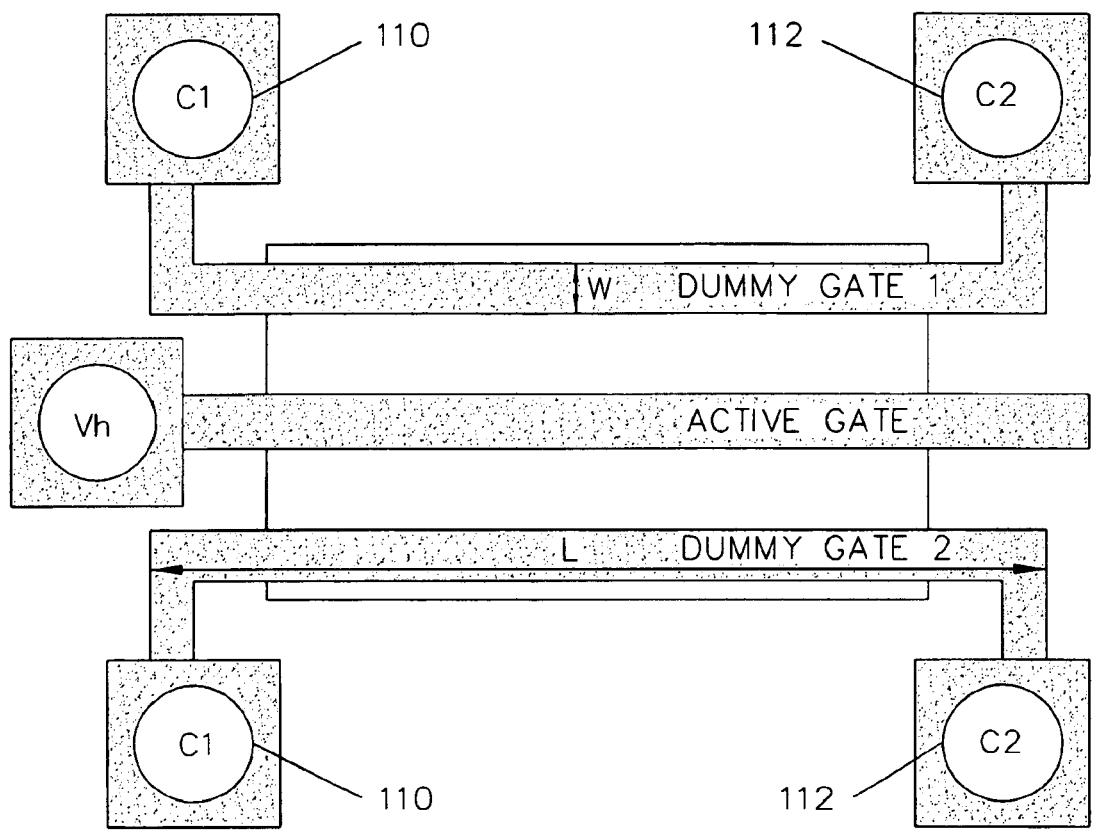
FIG. 8 is a schematic diagram of the external polygate resistors of the gate structure of the circuit of FIG. 7.
Figure 9:
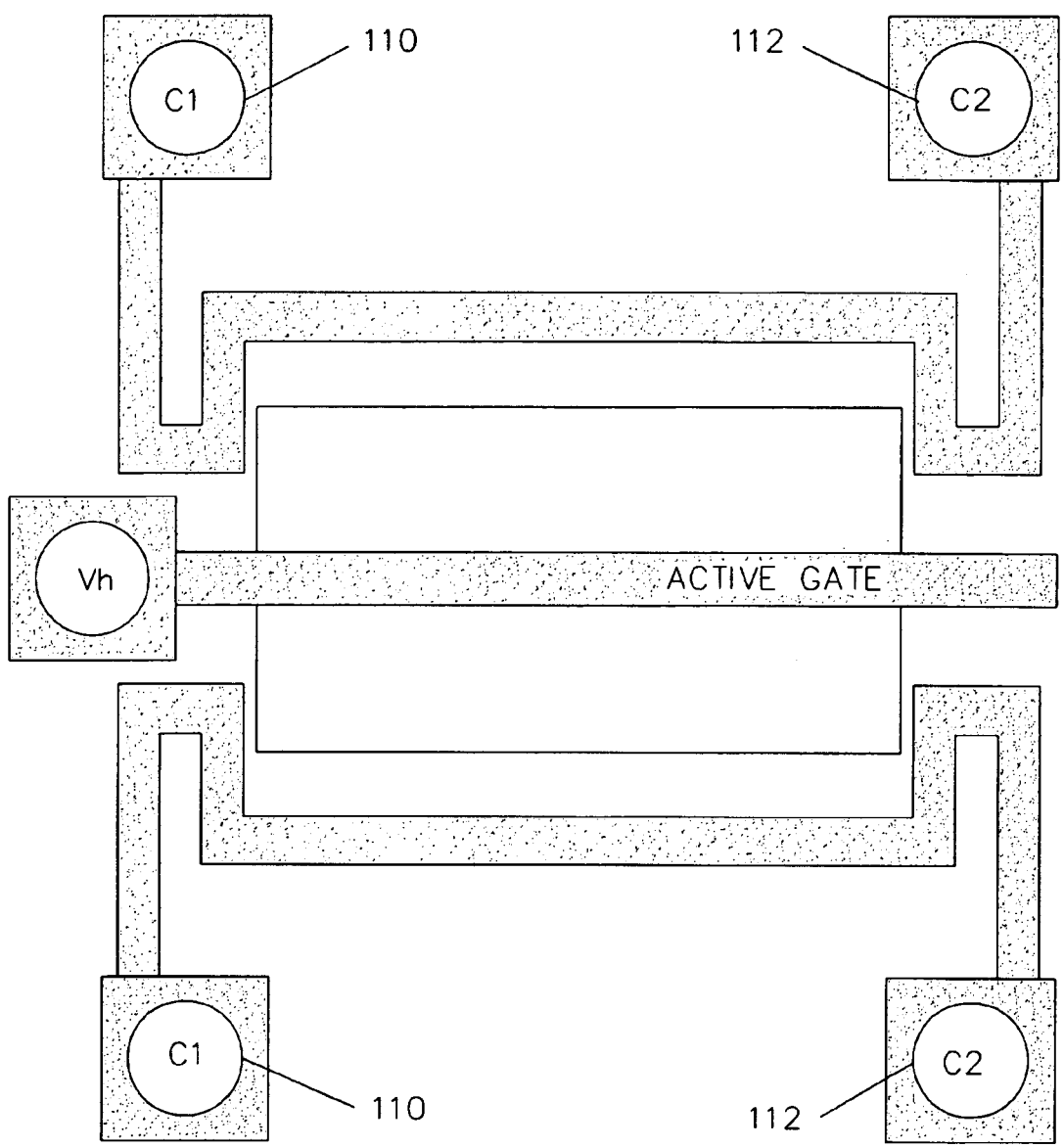
FIG. 9 is a schematic diagram of the external resistors the gate structure of the circuit of FIG. 7.

Referring to FIGS. 7 through 9, in still another aspect of the present invention, recovery circuit 100 can be implemented as a part of an AC operating circuit. As shown, preferably a pair of dummy gate polyresistors (DGPs) 128 can be operatively connected to gate structure 120 (e.g., a MOSFET) for localized self-heating and wearout recovery thereof. The DGPs 128 may be an integral with and/or external to gate structure 120.

The AC circuit design can be substantially similar to that of the DC operating circuit design shown in FIG. 4. However, in this particular aspect of the present invention, the third component 126 is preferably removed to eliminate any gate delay that may be contributed thereby. In addition, the DGPs 128 are preferably used in place of the AGP 118 of the DC circuit design. Thus, the DGPs 128 may preferably be activated via a voltage signal (Vh) that activates the first and second components 122, 124 so as to allow current to pass through the DGPs 128. This current flow preferably facilitates a SiO/Si interface, for example, being heated to a predefined recovery temperature.

Having described some of the preferred aspects of the present invention, a method for recovering a circuit and/or a circuit element in accordance with a preferred embodiment or aspect of the present invention is outlined hereafter. It is noted that the following process is illustrative and merely one way to achieve a desired circuit recovery using the present invention. Various alternatives and/or modifications may also be used and are within the scope of the present invention.

To effectively and efficiently recover a specific wearout sensitive circuit and/or circuit element damaged by a specific wearout mechanism (e.g., NBTI, HC, etc.), the recovery circuit 100 of the present invention is preferably operatively connected to the specific wearout sensitive circuit and/or a wearout sensitive circuit element such that, during operation of the wearout sensitive circuit, the recovery circuit can be activated via a voltage signal at any time as desired, such as, for example, after the wearout sensitive circuit and/or the wearout sensitive circuit element have been damaged a certain predefined amount. Preferably, prior to activating the recovery circuit, the wearout sensitive circuit may be operated so that components of recovery circuit 100 are floating.

The recovery process may also include determining which specific wearout sensitive circuit element is sensitive to which specific wearout mechanism. This step preferably allows an appropriate recovery mechanism to be ascertained and ultimately facilitates in quantifying an appropriate bake temperature to recover or repair the specific wearout damage. The recovery circuit can be activated via a voltage signal, for example, as many times as needed and at any time during operation.

As part of the recovery process, the wearout sensitive circuit and/or the wearout sensitive circuit element is/are preferably deactivated either before or concurrently with the activation of the recovery circuit 100. Once the recovery circuit 100 is activated, current can be driven through the recovery circuit facilitating localized heating of the wearout sensitive circuit and/or the wearout sensitive circuit element to a predefined bake temperature and for an appropriate amount of time to achieve a desired level of recovery.

It should be understood that the foregoing description is only illustrative of some of the embodiments of the present invention. Various alternatives and modifications can be devised by those skilled in the art without departing from the present invention. Accordingly, the present invention is intended to embrace all such alternatives, modifications and variances.

What is claimed is:

1. A recovery circuit comprising:
   at least one current driver;
   at least one first pass gate being connected in series with said current driver;
   at least one second pass gate being connected to a ground; and
   at least one recovery element, said at least one recovery element being operatively connected to a wearout sensitive element.

2. The recovery circuit of claim 1, wherein said first and second pass-gate are closed when a voltage signal activates said current driver so that current delivered by said current driver, passes through said recovery element to increase the temperature of said wearout sensitive element.

3. The recovery circuit of claim 2, wherein said one wearout sensitive element is a transistor.

4. The recovery circuit of claim 1, wherein said one wearout sensitive element is a MOSFET.

5. The recovery circuit of claim 2, wherein said one recovery element is a polyresistor.

6. The recovery circuit of claim 1, wherein said at least recovery element is external to said wearout sensitive element.

7. The recovery circuit of claim 1, wherein said at least recovery element is integral with said wearout sensitive element.

8. The recovery circuit of claim 1, wherein said at least recovery element allows self-heating of said wearout sensitive element.

9. The recovery circuit of claim 8, wherein said self-heating is localized and can be implemented at any time for partial or full recovery of said wearout sensitive element as appropriate in response to particular wearout degradation.

10. The recovery circuit of claim 1, wherein the recovery circuit can be implemented to any of a variety of circuit applications.

11. A method for recovery of a wearout sensitive circuit comprising the steps of:
    operatively implementing a recovery circuit to a specific wearout sensitive circuit and/or a specific wearout sensitive circuit element thereof;
    operating said specific wearout sensitive circuit; and
    activating said recovery circuit during operative use when said specific wearout sensitive circuit and/or said specific wearout sensitive circuit element is degraded a predefined amount.

12. The method of claim 11, wherein said specific wearout sensitive circuit is operated so that components of said recovery circuit are floating.

13. The method of claim 12, further comprising a step of determining which specific wearout sensitive circuit element is sensitive to which specific wearout mechanism.

14. The method of claim 13, further comprising the step of quantifying an appropriate bake temperature for an appropriate wearout recovery.

15. The method of claim 11, wherein said recovery circuit is activated by a voltage signal.

16. The method of claim 15, further comprising the step of deactivating said degraded specific wearout sensitive circuit and/or said wearout sensitive wearout element.

17. The method of claim 16, further comprising the step of driving current through said recovery circuit to allow localized heating of said specific wearout sensitive circuit and/or said specific wearout sensitive circuit element.

18. The method of claim 17, further comprising the step of locally heating said specific wearout sensitive circuit and/or said specific wearout sensitive circuit element to a predefined bake temperature.

19. The method of claim 18, wherein said specific wearout sensitive circuit and/or said specific wearout sensitive circuit element is/are locally heated for an appropriate amount of time to achieve a desired level of circuit recovery.

20. The method of claim 19, further comprising the step of deactivating said recovery circuit and reactivating said recovered specific wearout sensitive circuit and/or said recovered specific wearout sensitive circuit element.

* * * * *